United States Patent
Li et al.

(10) Patent No.: US 9,280,928 B2
(45) Date of Patent: Mar. 8, 2016

(54) APPARATUS AND METHOD FOR DRIVING LED DISPLAY

(71) Applicant: SCT TECHNOLOGY, LTD., Grand Cayman, KY (US)

(72) Inventors: Eric Li, Milpitas, CA (US); Shean-Yih Chiou, San Jose, CA (US); Shang-Kuan Tang, Fremont, CA (US); Xinchao Peng, Guangzhou (CN)

(73) Assignee: SCT TECHNOLOGY, LTD., Grand Cayman (KY)

( * ) Notice: Subject to any disclaimer, the term of this patent is extended or adjusted under 35 U.S.C. 154(b) by 132 days.

(21) Appl. No.: 14/056,742

(22) Filed: Oct. 17, 2013

(65) Prior Publication Data

US 2015/0109281 A1    Apr. 23, 2015

(51) Int. Cl.
*G09G 3/32* (2006.01)

(52) U.S. Cl.
CPC .......... *G09G 3/32* (2013.01); *G09G 2310/0216* (2013.01); *G09G 2310/0245* (2013.01); *G09G 2310/08* (2013.01); *G09G 2320/0233* (2013.01)

(58) Field of Classification Search
None
See application file for complete search history.

(56) References Cited

U.S. PATENT DOCUMENTS

2009/0002038 A1*    1/2009    Boerstler et al. .............. 327/157

\* cited by examiner

*Primary Examiner* — Kenneth B Lee, Jr.
(74) *Attorney, Agent, or Firm* — Novick, Kim & Lee, PLLC; Allen Xue

(57) ABSTRACT

An apparatus for driving LED display includes a plurality of phase locked loop circuits. Each of the phase locked loop circuits includes a divider configured to receive the voltage controlled output signal and generate the feedback signal, a memory configured to generate a modulation profile codes and a sigma delta block. The divider receives a randomized numbers so as to change a dividing ratio over a modulation period. The sigma delta block includes at least one sigma delta modulator and at least one gain block. The sigma delta block is configured to receive the modulation profile codes and generate the randomized numbers to the divider. Each of the at least one gain block is configured to generate a value that is multiplied to at least one of the at least one sigma delta modulator so as to change a spread spectrum modulation depth.

16 Claims, 11 Drawing Sheets

APPARATUS AND METHOD FOR DRIVING LED DISPLAY

FIELD OF THE INVENTION

This invention relates generally to an apparatus and a method for driving LED display.

BACKGROUND OF THE INVENTION

Light emitting diode (LED) is widely used for displaying information and message. LED is a solid state device that converts electric energy to light and requires reduced operational voltage and current. LED provides a higher level of brightness and greater optical efficiency as compared to other types of display panels.

The LED display panel includes an LED array and a plurality of driver chips. The total number of the M×N LED driver chips can vary depending on the size and resolution of the LED display panel.

For example, a high definition LED display panel may require 1,280×720 pixels or more. If each driver chip controls 64×16 LED pixels, then it will need a total of 900 driver chips. If 900 chips start to operate at the same time in response to a single serial clock signal, it will cause problematic electromagnetic radiation, such as Electromagnetic Interefernce (EMI).

To attenuate EMI radiation, the spread spectrum modulation depth controller can be used so that a modulation is performed with respect to the input frequency of a reference clock signal in an LED driver chip to spread the spectrum of an output clock signal, thereby reducing the peak value of EMI. Spread spectrum modulation depth controller provides modulated frequency so that the energy is spread out over a wider bandwidth. The attenuation achieved by the spread spectrum modulation depth controller is relative to the length of the horizontalness of the energy spectrum. The more evenly energy is spread over the bandwidth, the more attenuation is achieved.

However, when a plurality of spread spectrum modulation depth controllers are used, it is considerably more difficult to synchronize them, causing increased clock jitters and thus a new solution is required to change the spread spectrum modulation depth. Furthermore, a spread spectrum modulation depth controller usually comes with less than +/−1% spread spectrum modulation depth limit. Accordingly, apparatus and method that overcome the above described shortcomings are needed.

SUMMARY OF THE INVENTION

In view of the aforementioned problems, the present disclosure provides an apparatus and a method for driving LED display panel.

In one example of the apparatus for driving LED display includes a plurality of phase locked loop circuits, each of the phase locked loop circuits having a phase frequency detector configured to generate a phase difference signal according to a feedback signal and a reference signal, charge pump configured to receive the phase difference signal and to generate an output current according to the phase difference signal to adjust phase alignment, a loop filter configured to receive the output current and to convert the output current to a voltage controlled signal, a voltage controlled oscillator configured to receive the voltage controlled signal and to generate a voltage controlled output signal, and a divider configured to receive the voltage controlled output signal and generate the feedback signal, wherein the divider receives a sequence of randomized numbers so as to change a sequence of dividing ratios over a modulation period, a memory configured to generate a sequence of modulation profile codes, and a sigma delta block including at least one sigma delta modulator, and at least one gain block wherein the sigma delta block is configured to receive a sequence of modulation profile codes and generate a sequence of randomized numbers to the divider, and wherein each of the at least one gain block is configured to generate a value that is multiplied to at least one of the at least one sigma delta modulator so as to change a spread spectrum modulation depth value.

The at least one sigma delta modulator may have a plurality of sigma delta modulators, and the plurality of sigma delta modulators are coupled to one another in either a series or a parallel configuration.

The at least one gain block may have a plurality of gain blocks, and each of the gain blocks is coupled to at least one of the sigma delta modulators.

The at least one sigma delta modulator may have a first sigma delta modulator and a second sigma delta modulator, and wherein the first sigma delta modulator and the second sigma delta are coupled in parallel.

The at least one gain block may include a first and a second gain blocks, and wherein the first and second sigma delta modulators are coupled to the first and second gain blocks respectively.

The first gain block may be coupled between the first sigma delta modulator and the divider, and the second gain block may be coupled between the memory and the second sigma delta modulator.

The first and second gain blocks may have a first and a second values respectively, and wherein the first value is an integer value, and the second value is a fractional value. The second value may equal 0.1n, where n is an integer from 0 to 9.

The at least one sigma delta modulator may have a first sigma delta modulator, and the at least one gain block may have a first and a second gain blocks, and wherein the first gain block is coupled between the memory and the first sigma delta modulator, and the second gain block is coupled between the first sigma delta modulator and the divider.

The first gain block may generate a fractional value, and the second gain block generates an integer value.

According to another embodiment of the present invention, a method for driving a phase locked loop circuit of a LED display panel is provided. The method may include receiving a sequence of modulation profile codes, generating a sequence of randomized numbers by at least one sigma delta modulator, multiplying a value of at least one gain block so as to change a spread spectrum modulation depth value, changing a sequence of dividing ratios over a modulation period, receiving a reference clock and a feedback signal, outputting a phase difference signal, generating an output current according to the phase difference signal, converting the output current to a voltage controlled signal, and generating a voltage controlled output signal.

The method may include, in the following order, receiving a sequence of modulation profile codes, generating a sequence of randomized numbers by the at least one sigma delta modulator, and multiplying the value by the at least one gain block wherein the value is multiplied to at least one of the at least one sigma delta modulator so as to change the spread spectrum modulation depth value.

The method may include, in the following order, receiving a sequence of modulation profile codes, multiplying the value to the sequence of profile codes by the at least one gain block so as to change the spread spectrum modulation depth value, and generating the sequence of randomized numbers by the at least one sigma delta modulator.

The at least one sigma delta modulator may have a first sigma delta modulator and a second sigma delta modulator, and wherein the at least one gain block comprises a first and a second gain blocks, and wherein the first and second sigma delta modulators are coupled to the first and second gain blocks respectively.

The first sigma delta modulator and the second sigma delta may be coupled in parallel.

The method of receiving a sequence of modulation profile codes, generating a sequence of randomized numbers, and multiplying a value may be, in the following order, receiving a sequence of modulation profile codes from a memory, generating a sequence of randomized numbers by the first sigma delta modulator, multiplying a first value to the first sigma delta modulator by the first gain block wherein the first value is an integer value, multiplying a second value to the modulation profile codes by the second gain block wherein the second value is a fractional value, and receiving an output of the second gain block and generating the sequence of randomized numbers by the second sigma delta modulator. The second value may equal 0.1n, where n is an integer from 0 to 9.

The at least one sigma delta modulator may have a first sigma delta modulator, and the at least one gain block has a first and a second gain blocks, wherein the method of receiving a sequence of modulation profile codes, generating a sequence of randomized numbers, and multiplying a value having, in the following order, receiving the sequence of modulation profile codes from a memory, multiplying a first value to the sequence of modulation profile codes by the first gain block wherein the first value is a fractional value, generating the sequence of randomized numbers by the first sigma delta modulator, and multiplying a second value to the sequence of randomized number by the second gain block wherein the second value is an integer value. The first value may equal 0.1n, where n is an integer from 0 to 9.

According to the other embodiment of the present invention provides an apparatus for driving LED display. The apparatus for driving LED display may include a plurality of phase locked loop circuits, each of the phase locked loop circuits having a phase frequency detector configured to generate a phase difference signal according to a feedback signal and a reference signal, a charge pump configured to receive the phase difference signal and to generate an output current according to the phase difference signal so as to adjust phase alignment, a loop filter configured to receive the output current and to convert the output current to a voltage controlled signal, a voltage controlled oscillator configured to receive the voltage controlled signal and to generate a voltage controlled output signal, a divider configured to receive the voltage controlled output signal and generate the feedback signal, wherein the divider receives a sequence of randomized numbers so as to change a sequence of dividing ratios over a modulation period, a memory configured to generate a sequence of modulation profile codes, and a sigma delta block having a plurality of sigma delta modulators, and a plurality of gain blocks wherein the sigma delta block is configured to receive a sequence of modulation profile codes and generate a sequence of randomized numbers to the divider, wherein the plurality of the sigma delta modulators are coupled one another in parallel, wherein at least one of the plurality of the gain blocks is coupled to at least one of the sigma delta modulators, wherein at least one of the gain blocks is configured to generate either an integer value or a fractional value, wherein at least one of the integer value and the fractional value is multiplied to at least one of the sigma delta modulators so as to change a spread spectrum modulation depth value.

DETAILED DESCRIPTION OF THE EMBODIMENT

Figure 1:
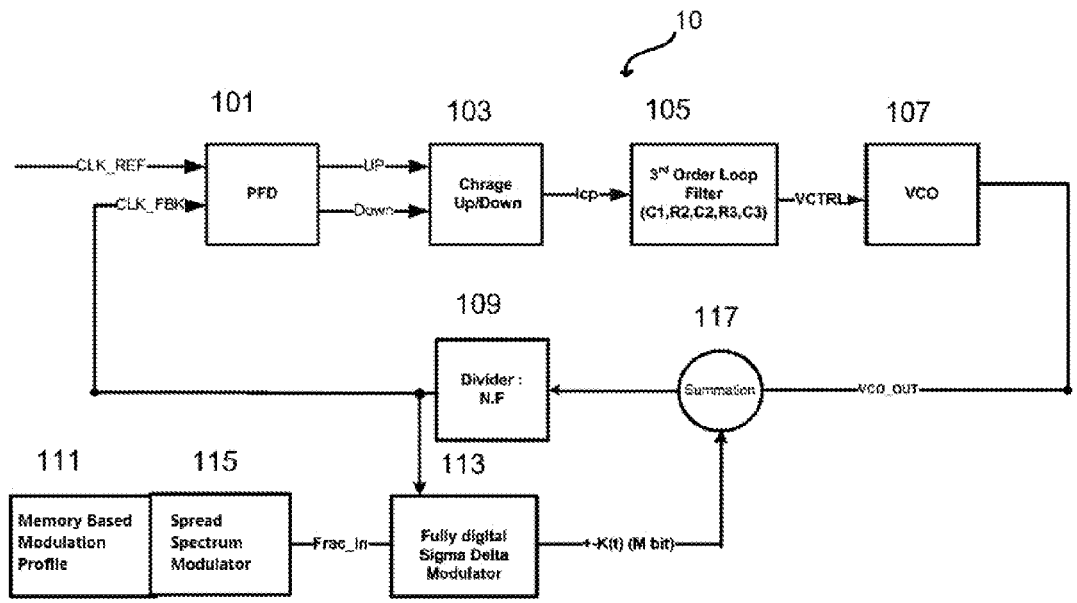
FIG. 1 is a schematic block diagram showing a configuration of a phase locked loop.

Reference will now be made in detail to embodiments, examples of which are illustrated in the accompanying drawings, wherein like reference numerals refer to the like elements throughout the several views. In this regard, the present embodiments may have different forms and should not be construed as being limited to the descriptions set forth herein. Accordingly, the embodiments are merely described below, by referring to the figures, to explain aspects of the present description. Terms used herein are for descriptive purposes only and are not intended to limit the scope of the disclosure. The terms "comprises" and/or "comprising" are used to specify the presence of stated elements, steps, operations, and/or components, but do not preclude the presence or addition of one or more other elements, steps, operations, and/or components. The terms "first," "second," and the like may be used to describe various elements, but do not limit the elements. Such terms are only used to distinguish one element from another. These and/or other aspects become apparent and are more readily appreciated by those of ordinary skill in the art from the following description of embodiments of the present disclosure, taken in conjunction with the accompanying drawings. The figures depict embodiments of the present disclosure for purposes of illustration only. One skilled in the art will readily recognize from the following description that alternative embodiments of the structures and methods illustrated herein may be employed without departing from the principles of the disclosure described herein.

FIG. 1 is a schematic block diagram showing a configuration of a phase locked loop with a spread spectrum modulator. The phase locked loop 10 includes a phase frequency detector (PFD) 101, a charge pump 103, a loop filter 105, a voltage controlled oscillator (VCO) 107, a divider 109, a memory 111, a sigma delta modulator 113, and a spread spectrum modulator 115, and a summation block 117.

The PFD 101 is configured to generate a phase difference signal according to a feedback signal and a reference signal. PFD 101 receives the feedback signal and the reference signal, and outputs a phase difference signal.

The charge pump 103 is configured to receive the phase difference signal and generates an output current according to the phase difference signal to adjust a phase alignment. The phase difference is used to turn on the pump-up or pump-down current source in the charge pump 103. The charge pump 103 switches between charging and discharging of a charge current.

The loop filter 105 is configured to receive the output current and converts the output current to a voltage controlled signal. The loop filter 105 uses a higher order filter to reduce various types or source of phase noises and harmonics. For example, the loop filter 105 can be configured to use a $3^{rd}$ or $4^{th}$ order loop filter to reduce noises.

The VCO 107 is configured to receive the voltage controlled signal and generates a voltage controlled output signal. The VCO 107 oscillates at a frequency depending on the voltage controlled signal. The adjustment of the charge pump 103 results in changing the voltage controlled signal to the VCO so that its phase is retarded or advanced.

The divider 109 is coupled to the VCO 107 and configured to change a sequence of dividing ratios over the modulation period in accordance with a sequence of patterns generated by the spread spectrum modulator 115 coupled with sigma delta modulator 113. The phase locked loop 10 is a fractional phase locked loop that multiplies by an integer and a fraction. The fractional value can be generated from the divider 109 through the averaging effect over the modulation periods. In other words, the dividing ratio keeps dynamically changing over the modulation periods with high frequency. In this way, the divider 109 reflects a sequence of patterns generated by the spread spectrum modulator 115. The divider 109 divides a frequency of the voltage controlled output signal from the VCO 107 to generate the feedback signal.

The memory 111 is configured to contain the modulation profile codes, such as triangular shape with a percentage adjustment. The memory 111 may include a ROM, a RAM, a form of flip-flop. The memory 111 generates the n bit codes in 2's complement format. The VCO frequency will be modulated by this memory codes coupling with a sequence of randomized output data from sigma delta modulator 113.

The sigma delta modulator 113 is configured to operate together with the divider 109. The sigma delta modulator 113 generates randomized data +−K(t). A summation block 117 receives the randomized data +−K(t) which is added to the integer value N and transmits it to the divider 109.

The spread spectrum modulator 115 is coupled to the sigma delta modulator 113 and configured to change a modulation depth value. The modulation depth is a frequency range within which the clock makes the frequency excursion at the rate of a modulation rate. The modulation depth value is denoted by the percentage (%) spread, which is the ratio of the band of frequency excursion to the output clock frequency. For example, a 100 MHz clock with a −1% to +1% modulation depth indicates that the modulation clock is varying within a band of 99 MHz to 101 MHz. This determines the amount of peak EMI reduction. Generally, the higher the modulation depth, the greater is the EMI reduction. The modulation rate is the rate at which the energy of the clock source is distributed within the band of frequencies around the output clock frequency. Modulation profile will determine the effectiveness of the peak EMI reduction.

Figure 2:
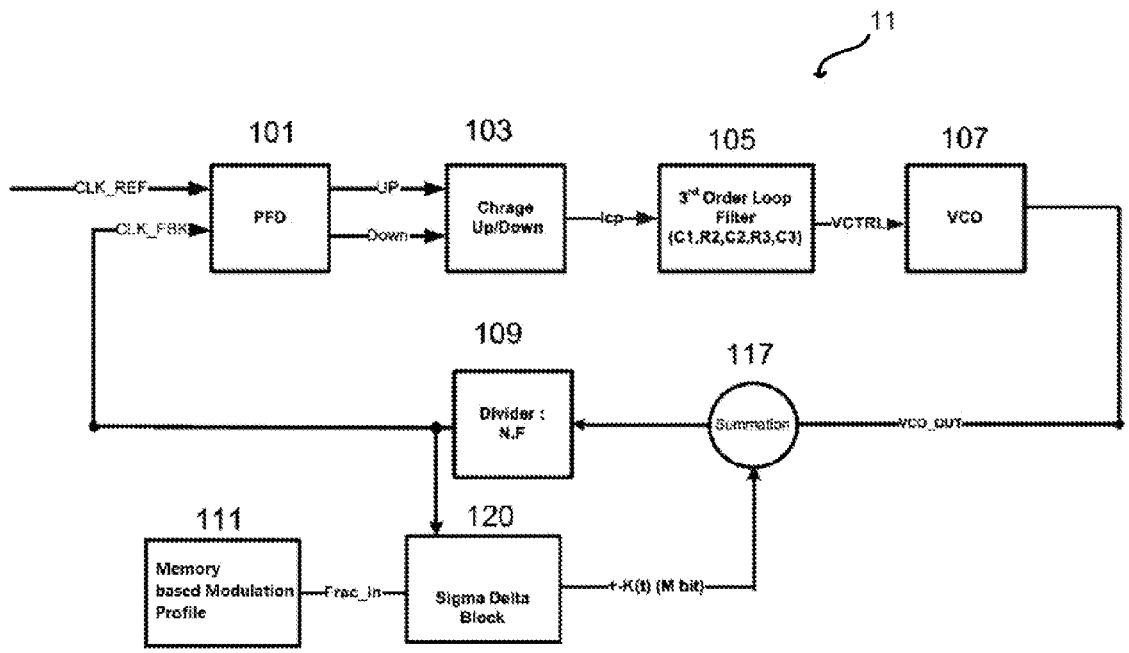
FIG. 2 is a schematic block diagram showing a configuration of a phase locked loop with a sigma delta block according to an embodiment of the present disclosure.

According to one embodiment of the present disclosure, a phase locked loop that is programmable to adjust a spread spectrum modulation depth will be described with reference to FIGS. 2 and 3. FIG. 2 is a schematic block diagram showing a configuration of a phase locked loop 11 with a sigma delta block 120 according to an embodiment of the present disclosure.

As shown in FIG. 2, the phase locked loop 11 includes a phase frequency detector (PFD) 101, a charge pump 103, a loop filter 105, a voltage controlled oscillator (VCO) 107, a divider 109, a memory 111, a summation block 117, and a sigma delta block 120.

Figure 3A:
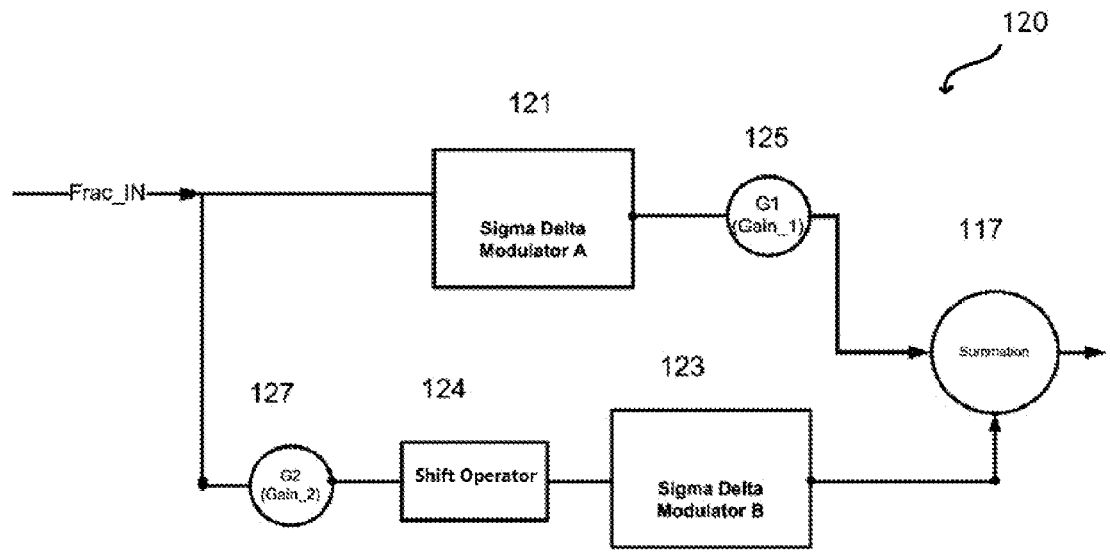
FIG. 3A is a schematic block diagram showing a configuration of the sigma delta block.

The corresponding elements as those of the example as shown in FIG. 1 are designated by like reference numerals, and an explanation thereof will thus be omitted. FIG. 3A is a schematic block diagram showing a configuration of the sigma delta block 120. The sigma delta block 120 includes a first sigma delta modulator 121, a second sigma delta modulator 123, a shift operator 124, a first gain block 125, and a second gain block 127. The first sigma delta modulator 121 is coupled to the first gain block 125, and the output of the first sigma delta modulator 121 is multiplied by a first value G1 of the first gain block 125. The modulation profile input data from the memory 111 is multiplied by a second value G2 of the second gain block 127 and is input to the shift operator 124. The shift operator 124 performs a X-bit right shift, where X is an integer number. The X-bit right shifted data is input to the second sigma delta modulator 123. The first sigma delta modulator 121 and the second sigma delta 123 are connected in a parallel configuration.

It should be understood that the configuration as shown in FIGS. 2 and 3 are only for the exemplary purpose rather than any limitation to the present disclosure. For example, although the exemplary embodiment includes two sigma delta modulators 121 and 123 and two gain blocks 125 and 127, one will understand that the technical concept of the present embodiment is applicable to a larger number of sigma delta modulators and gain blocks combined either in a series or a parallel configuration. Also, even though the first gain block 125 is coupled between the first sigma delta modulator 121 and the summation block 117, the first gain block 125 can be coupled between the first sigma delta modulator 121 and the memory 111.

As stated above, the spread spectrum modulation depth is a frequency range within which the clock makes the frequency excursion at the rate of a modulation rate. According to one embodiment of the present disclosure, the spread spectrum modulation depth is adjusted by changing at least one of the values of the first and second gain blocks 125 and 127.

The first and second sigma delta modulators 121 and 123 can be configured to have a $3^{rd}$ or more order digital sigma delta modulators that follow the modulation profile from the memory code so as to generate randomized data +−K(t). The first and second sigma delta modulators 121 and 123 not only randomize the modulating code but also shift the phase noises (which is generated from changing-ratio-divider) to high frequencies so that it becomes easier to filter these phase noise out. In this way, it reduces and attenuates the unwanted frequency spur resulting from the divider's "fractional operations." The first and second sigma delta modulators 121 and 123 also attenuate phase noises to insignificant levels close to the center frequency.

Refer to FIG. 1, the PFD 101 detect the phase difference between reference clock (CLK_REF) and the feedback clock (CLK_FBK) from the VCO 107 and the divider 109. The phase error at the PFD 101 is reflected in the output current at the charge pump 103. The output current is converted to a voltage signal by the loop filter 105. Thus, the attenuated randomized noise waveform appears on the voltage controlled output signal. As a result, the VCO 107 is modulated with spread spectrum frequency span but the unwanted frequency spur are also attenuated by both the ramdomization and noise shaping from sigma delta operations.

The frequency of a fractional-N PLL can be synthesized by a fractional-N synthesizer according to the following equation:

$$f_{vco\_out}=(N+k/M) \times f_{vco\_in} \text{ (where } k \text{ and } M \text{ are integers)} \quad \text{[Equation 1]}$$

The variable M is a measure of the fractionality that a fractional-N synthesizer can provide. It is usually referred to as "fractional modulus." The integer number k can assume any number between 0 and M. The non-integer number (N+k/M) is often written as N.F, where the dot denotes a decimal point, and N and F represent the integer and the fractional parts of the number, respectively.

The divider 109 is multi-modulus divider, which is dynamically changing the dividing ratio over the modulation periods. As described above, the continuously changing dividing ratio is reflected in the voltage controlled output signal.

With reference to FIG. 3A, the spread spectrum modulation depth adjustment mechanism will be described. The fractional value F is generated by the first sigma delta modulator 121 with the value G1 being respectively multiplied. The randomized data +−K(t) varies the integer number between −K and +K, where K is an integer number. The maximum value of K depends on the order of sigma delta modulators. A configuration arranged as described in FIG. 3A may design a signal transfer function of M-th order sigma delta modulator as $Z^{-n}$, where n is greater or equal to M. In such an arrangement, the average quantity of K converges to 1 over a period of time. Therefore, when G2 is zero, the spread spectrum modulation depth (G1/N) may be obtained by controlling the value of G1.

As shown in FIG. 3A, the second sigma delta modulator 123 is coupled to a shift operator 124. The shift operator 124 performs a X-bit right shift, where X is an integer number. After X-bit right shift, input value is multiplied by the value of G2 to form the fraction part of the spread spectrum modulation depth. For example, if X is 3, the spread spectrum modulation depth becomes ((G1+(G2/8))/N.

The arithmetic can be performed in 2's complemented format implemented either by combinations of add, shift right, shift left function or multiplication logic. The merit of the implementation shown in FIG. 3A is that it allows multiplierless logic. In such cases, with reference to FIG. 3A, the spread spectrum modulation depth can be denoted to as (G1+G2/p) % where the N value of N.F is chosen as 100; the values G1 and G2 are integer numbers; and the value p may be referred to $2^x$. Examples of (G1+G2/p) % are described in table 1 below.

TABLE 1

| (G1 + G2/p) % | G1 | G2 | P |
|---|---|---|---|
| +−6 | 6 | 0 | |
| +−5.875 | 5 | 7 | 8 |
| +−4.625 | 4 | 5 | 8 |
| +−3.0 | 3 | 0 | |
| +−2.375 | 2 | 3 | 8 |
| +−1.125 | 1 | 1 | 8 |
| +−0.875 | 0 | 7 | 8 |
| +−0.5625 | 0 | 9 | 16 |
| +−0.625 | 0 | 5 | 8 |
| +−0.375 | 0 | 3 | 8 |

The spread spectrum modulation depth can be adjusted by changing at least one of G1, G2 and X values. If values of X are 1, 2, 3, and 4, values of p may be 2, 4, 8, and 16 correspondingly.

More generally, the Frac_In data from the memory 111 is fed into two paths as shown in FIG. 3A. The Frac_In data is multiplied by a second value G2 of the second gain block 127, which serves as the input to the shift operator 124, and the Frac_In data will be input to the second sigma data modulator 123.

Figure 3B:
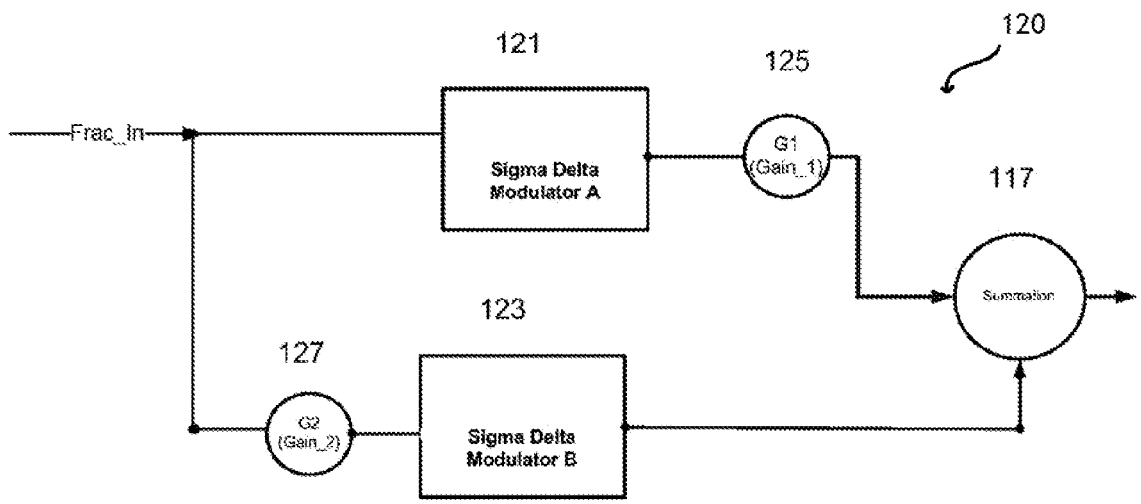
FIG. 3B is a variant of an embodiment shown in FIG. 3A showing a configuration of the sigma delta block.

FIG. 3B is another embodiment of the sigma delta block 120. It includes a first sigma delta modulator 121, a second sigma delta modulator 123, a first gain block 125, and a second gain block 127. The first sigma delta modulator 121 is coupled to the first gain block 125, and the output of the first sigma delta modulator 121 is multiplied by a first value G1 of the first gain block 125. The modulation profile input data from the memory 111 is multiplied by a second value G2 of the second gain block 127 and is input to the second sigma delta modulator 123. The first sigma delta modulator 121 and the second sigma delta 123 are connected in a parallel configuration.

For example, the spread spectrum modulation depth can be referred to as (G1+G2) %, where the first value G1 is an integer and the second value G2 equal 0.1n, where n is an integer from 0 to 9. (G1+G2)% can be −6.0%, −5.9%, −5.8%, . . . , −0.1%, 0, 0.1%, . . . , 5.8%, 5.9%, +−6%. The spread spectrum modulation depth can be adjusted by changing at least one of the first and second values. Here, G1 or G2 can be zero or any fractional number. Values of G1 and G2 are described here for exemplary purpose only and not limited thereto. For instance, values of G1 and G2 may have any number in a range of −9.9 to +9.9, but also satisfy (G1+G2) <9.9.

In FIG. 3B, for instance, the first value G1 of the first gain block 125 may be zero and the second value G2 of the second gain block 127 may be 0.5. Thus, the G1(0)%+G2(0.5)% equals to 0.5%. It is examined whether the sigma delta block 120 having the first and second gain blocks 125 and 127 functions as a 0.5% spread spectrum modulation depth modulator. In this case, the result from the embodiment of FIG. 3B is described hereafter with reference to FIGS. 4A, 4B, 4C, 4D and 5.

Figure 4A:
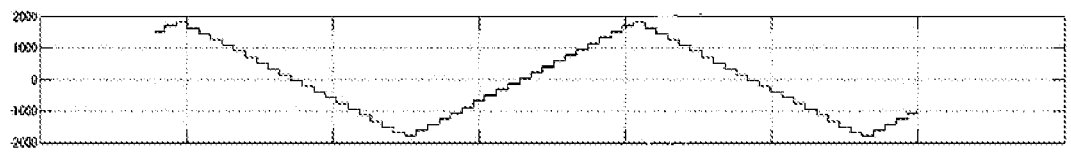
FIG. 4A is a graph showing a modulation profile input data from the memory according to one exemplary of an embodiment.
Figure 4B:
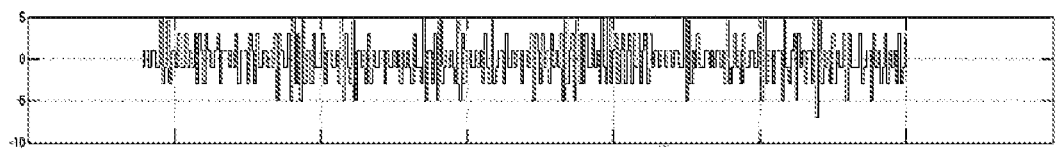
FIG. 4B is a graph showing the randomized data +−K(t) when the first value is a zero and the second value is 0.5.
Figure 4C:
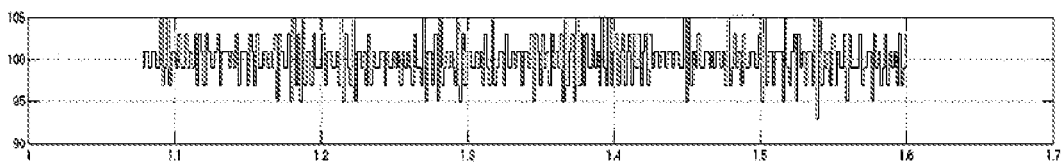
FIG. 4C is a graph showing a sum of N and the randomized data +−K(t).
Figure 4D:
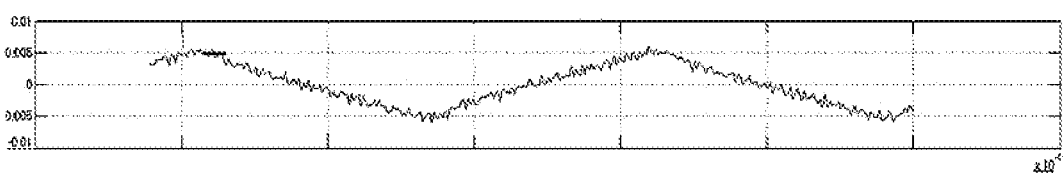
FIG. 4D is a graph showing the control voltage signal for VCO.
Figure 5:
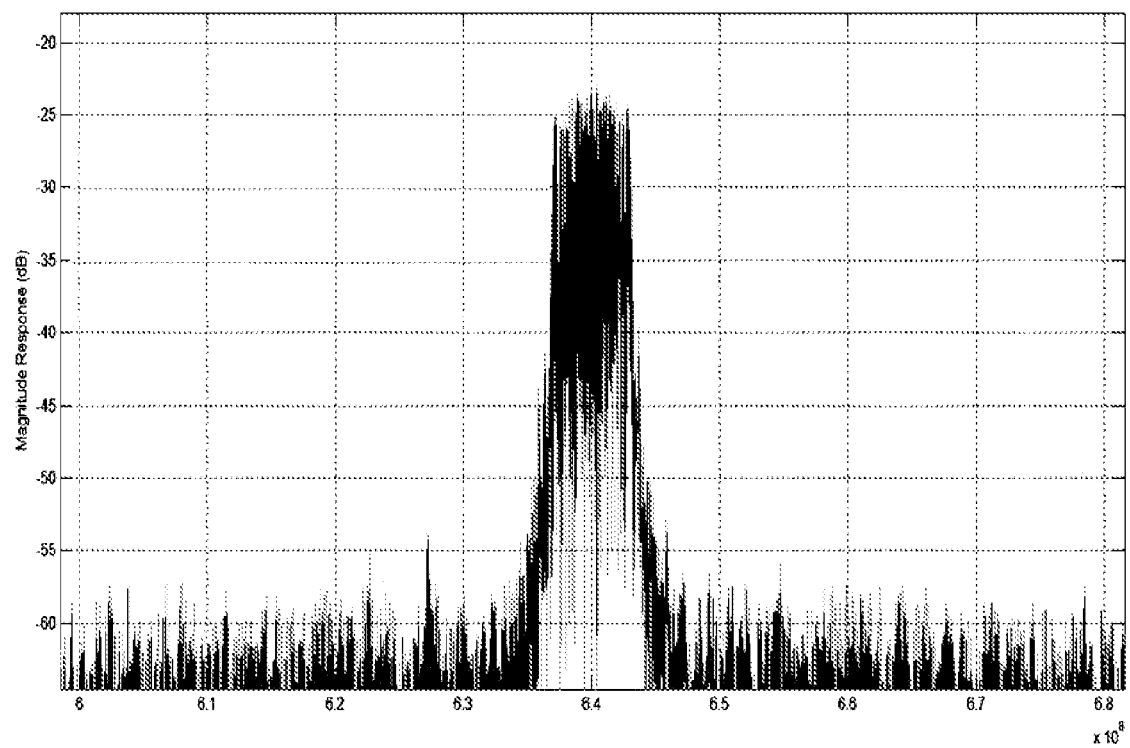
FIG. 5 is a Fast Fourier Transform (FFT) graph of the control voltage signal for VCO having a 640 MHz clock with a −0.5% to +0.5% modulation depth.

FIG. 4A is a graph showing the modulation profile input data. The input data from the memory 111 has a triangular shape. Here, the triangular shape is described for exemplary purpose only, and the memory 111 may has various memory code shapes. FIG. 4B is a graph showing the randomized data +−K(t) when the first value G1 is zero and the second value G2 is 0.5. The first and second sigma delta modulators 121 and 123 receive the input data from the memory 111 and generate randomized data +−K(t). FIG. 4C is a graph showing a sum of N and the randomized data +−K(t). FIG. 4D is a graph showing the control voltage signal for VCO 107. The waveform of the control voltage signal for VCO has a triangular shape with fluctuations reflecting the randomized data. FIGS. 4A, 4B, 4C and 4D have the same time grid along an X-axis. FIG. 5 is a Fast Fourier Transform (FFT) graph of the control voltage signal for VCO 107 having a 640 MHz clock with a −0.5% to +0.5% modulation depth. The FFT is a digital implementation of the Fourier transform. The FFT converts a time-domain data into the frequency-domain data. 0.5% of 640 MHz is 3.2 MHz. Thus, a 640 MHz clock with −0.5% to +0.5% modulation depth indicates that the modulation clock is varying within a band of 636.8 MHz to 643.2 MHz. Referring to FIG. 5, the FFT graph has X-axis of frequencies and Y-axis of a magnitude response in a log scale (dB). The modulation clock has a high magnitude within a band of 636.8 MHz to 643.2 MHz along with X-axis. Thus, the graph of FIG. 5 shows that the sigma delta block 120 having the first and second gain blocks 125 and 127 successfully functions as a 0.5% spread spectrum modulation depth modulator. The sigma delta block 120 spreads the system clock's peaking energy within a band of 636.8 MHz to 643.2 MHz so that it reduces the EMI radiation.

For another example, the first value G1 of the first gain block 125 is 2 and the second value G2 of the second gain block 127 is zero. Thus, the G1(2)+G2(0)% equals to 2.0%. It is examined whether the sigma delta block 120 having the first and second gain blocks 125 and 127 functions as a 2.0% spread spectrum modulation depth modulator. The result is described hereafter with reference to FIGS. 6A, 6B, 6C, 6D and 7.

Figure 6A:
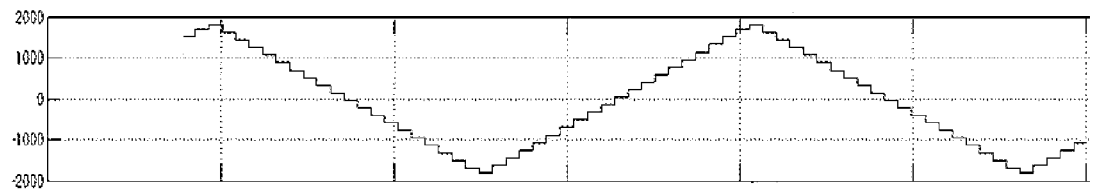
FIG. 6A is a graph showing the modulation profile input data from the memory according to another exemplary of an embodiment.
Figure 6B:
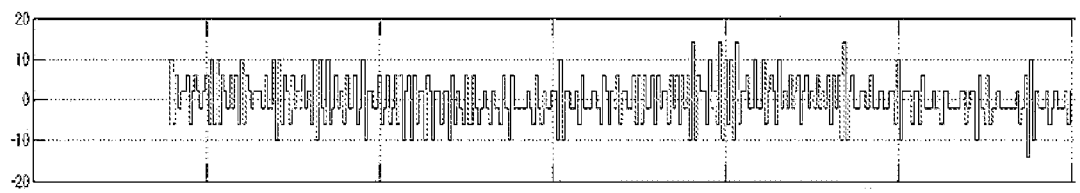
FIG. 6B is a graph showing the randomized data +−K(t) when the first value is 2 and the second value is a zero.
Figure 6C:
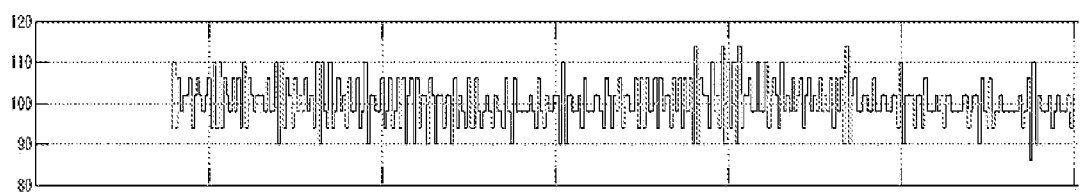
FIG. 6C is a graph showing a sum of N and the randomized data +−K(t).
Figure 6D:
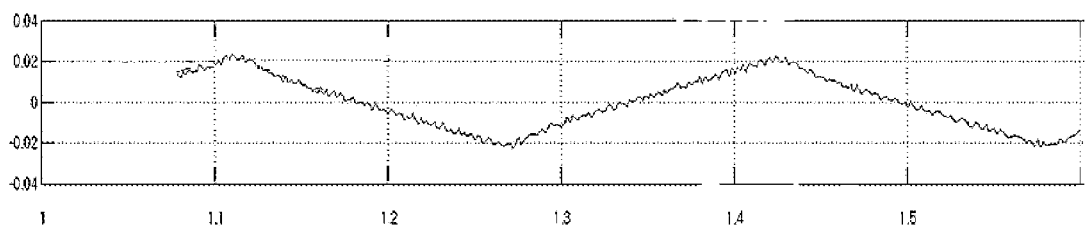
FIG. 6D is a graph showing the control voltage signal for VCO.
Figure 7:
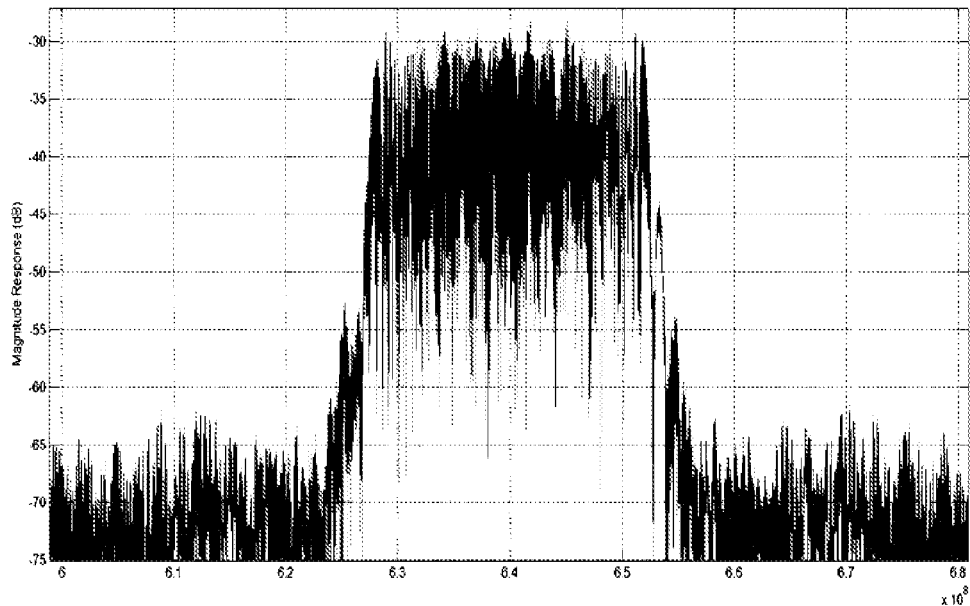
FIG. 7 is a Fast Fourier Transform (FFT) graph of the control voltage signal for VCO having a 640 MHz clock with a −2.0% to +2.0% modulation depth.

FIG. 6A is a graph showing the modulation profile input data. The input data from the memory 111 has a triangular shape. FIG. 6B is a graph showing the randomized data +−K (t) when the first value G1 is 2 and the second value G2 is zero. The first and second sigma delta modulators 121 and 123 receive the input data from the memory 111 and generate randomized data +−K(t). FIG. 6C is a graph showing a sum of N and the randomized data +−K(t). FIG. 6D is a graph showing the control voltage signal for VCO 107. The waveform of the control voltage signal for VCO has a triangular shape with fluctuations reflecting the randomized data. FIGS. 6A, 6B, 6C and 6D have the same time grid along an X-axis. FIG. 7 is a Fast Fourier Transform (FFT) graph of the control voltage signal for VCO 107 having a 640 MHz clock with a −2.0% to +2.0% modulation depth. 2.0% of 640 MHz is 12.8 MHz. Thus, a 640 MHz clock with −2.0% to +2.0% modulation depth indicates that the modulation clock is varying within a band of 627.2 MHz to 652.8 MHz. Referring to FIG. 7, the FFT graph has X-axis of frequencies and Y-axis of a magnitude response in a log scale (dB). The modulation clock has a high magnitude within a band of 627.2 MHz to 652.8 MHz along with X-axis. Thus, the graph of FIG. 7 shows that the sigma delta block 120 having the first and second gain blocks 125 and 127 successfully functions as a 2.0% spread spectrum modulation depth modulator. The sigma delta block 120 spreads the system clock's peaking energy within a band of 627.2 MHz to 652.8 MHz so that it reduces the EMI radiation.

Usually, a spread spectrum modulation depth controller comes with less than +/−1.0% spread spectrum modulation depth limit. However, a desired spread spectrum modulation depth can be obtained by changing at least one of the values G1 and G2 of the gain blocks 121 and 123 respectively. Thus, the spread spectrum modulation depth can be configured to be set without limits.

Figure 8:
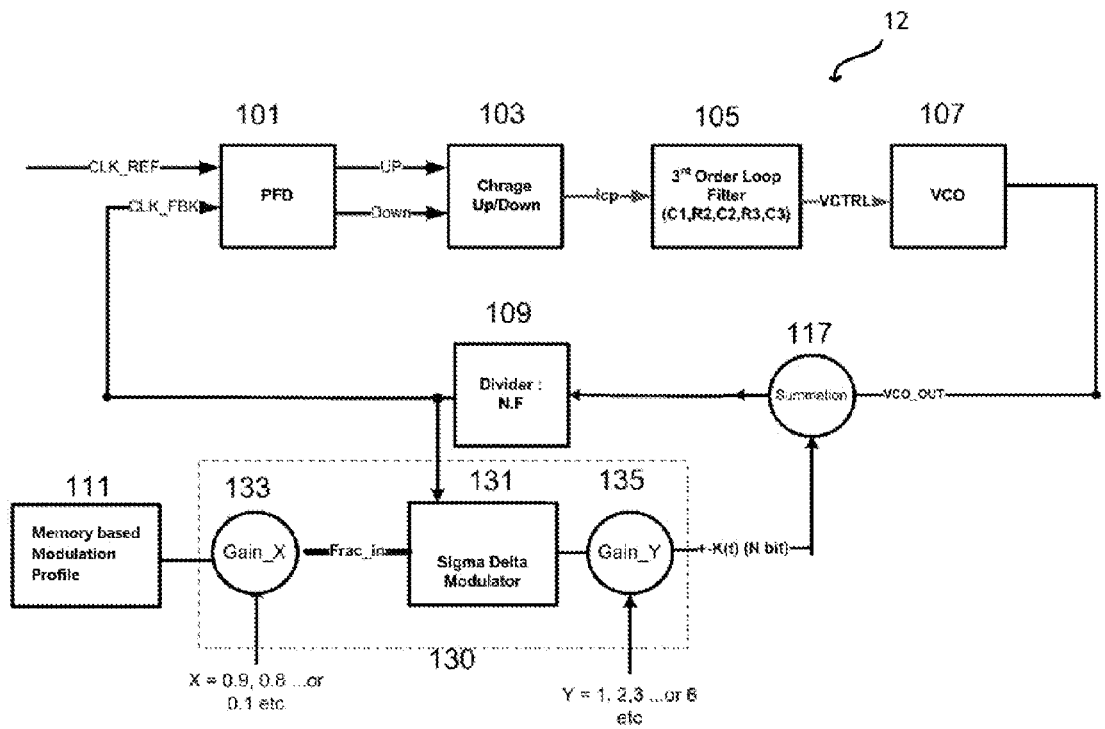
FIG. 8 is a schematic block diagram showing a configuration of a phase locked loop with a sigma delta block according to another embodiment of the present disclosure.

According to a further embodiment, a phase locked loop 12 that is programmable to adjust a spread spectrum modulation depth will be described with reference to FIG. 8. As shown in FIG. 8, the phase locked loop 12 includes a phase frequency detector (PFD) 101, a charge pump 103, a loop filter 105, a voltage controlled oscillator (VCO) 107, a divider 109, a memory 111, a summation block 117, and a sigma delta block 130. In this embodiment, an attenuation factor having less than 1 gain value (Gain_X) is added to the input data stream to the first sigma delta modulator 131 so that signal overflow can be avoided.

The corresponding elements as those of the example as shown in FIGS. 1 and 2 are designated by like reference numerals, and an explanation thereof will thus be omitted. The sigma delta block 130 includes a first sigma delta modulator 131, a first gain block 133, and a second gain block 135.

The modulation profile input data from the memory 111 is multiplied by a first value G1 of the first gain block 133 and is input to the first sigma delta modulator 131. The first sigma delta modulator 131 is coupled to the second gain block 135, and the output of the first sigma delta modulator 131 is multiplied by a second value G2 of the second gain block 135. According to the embodiment in FIG. 8, the spread spectrum modulation depth is adjusted by changing at least one of the first and second values G1 and G2 of the first and second gain blocks 133 and 135.

It should be understood that the configuration as shown in FIG. 8 is only for the exemplary purpose rather than any limitation to the present disclosure. For example, although the exemplary embodiment includes one sigma delta modulator 131 and two gain blocks 133 and 135, one will understand that the technical concept of the present embodiment is applicable to a larger number of sigma delta modulators and gain blocks combined in a series or a parallel configuration.

A desired spread spectrum modulation depth can be obtained by a multiplication of the first and second values G1 and G2 of the first and second gain blocks 133 and 135. Thus, the spread spectrum modulation depth can be referred to as (G1×G2) %. For instance, the first value G1 can be a fractional number, and the second value G2 can be an integer. The first value G1 can be zero or the multiples of 0.1. Thus, (G1×G2)% can be −6.0%, −5.9%, −5.8%, . . . , −0.1%, 0%, 0.1%, . . . , 5.8%, 5.9%, and 6%. The spread spectrum modulation depth can be adjusted by changing at least one of the first and second values G1 and G2. Values of G1 and G2 are described here for exemplary purpose only, and not limited thereto. For instance, values of G1 and G2 may have any number in a range of −9.9 to +9.9, but also satisfy (G1+G2) <9.9.

One example of the embodiment includes that the first value G1 is 0.6, and the second value G2 is 1. Thus, G1 (0.6)×G2 (1) equals to 0.6%. It is examined whether the sigma delta block 130 properly functions as a 0.6% spread spectrum modulation depth modulator. The result is described hereafter with reference to FIGS. 9A, 9B, 9C, 9D and 10.

Figure 9A:
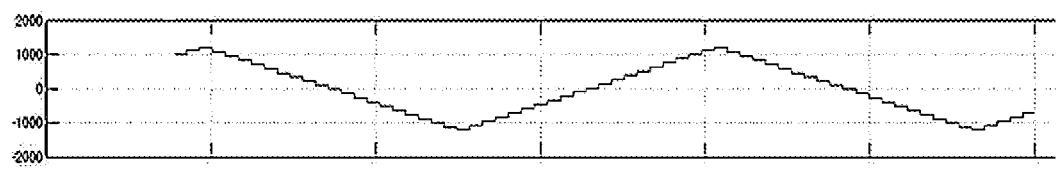
FIG. 9A is a graph showing the modulation profile input data from the memory according to one exemplary of another embodiment.
Figure 9B:
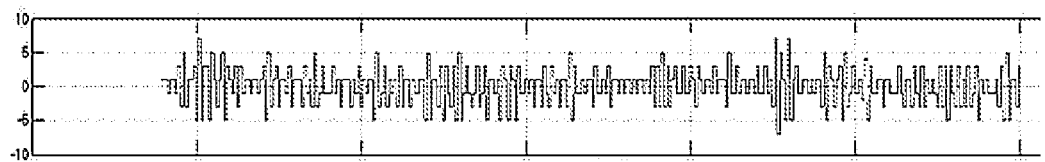
FIG. 9B is a graph showing the randomized data +−K(t) when the first value is 0.6 and the second value is 1.
Figure 9C:
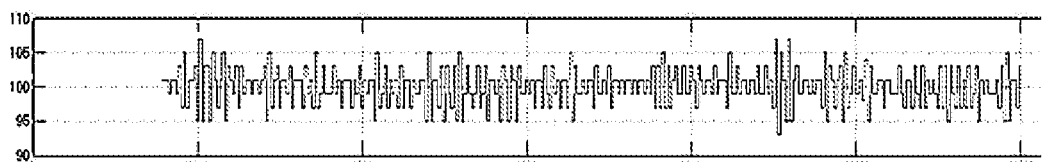
FIG. 9C is a graph showing a sum of N and the randomized data +−K(t).
Figure 9D:
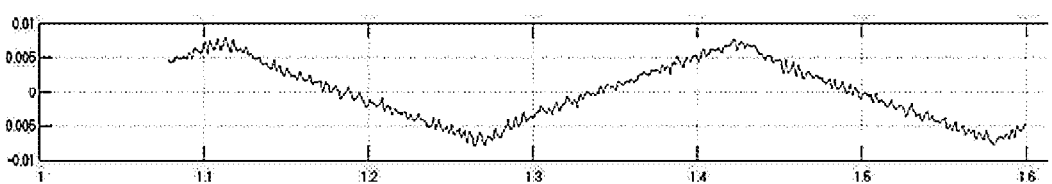
FIG. 9D is a graph showing the control voltage signal for VCO.

FIG. 9A is a graph showing the modulation profile input data. The input data from the memory 111 has a triangular shape. FIG. 9B is a graph showing the randomized data +−K(t) when the first value is 0.6 and the second value is 1. FIG. 9C is a graph showing a sum of N and the randomized data +−K(t). FIG. 9D is a graph showing the control voltage signal for VCO 107. The waveform of the control voltage signal for the VCO has a triangular shape with fluctuations reflecting the randomized data. FIGS. 9A, 9B, 9C and 9D have the same time grid along an X-axis.

The modulation profile input data from the memory 111 is multiplied by the first value G1(0.6) before input into the first sigma delta modulator 131. The first sigma delta modulator 131 generates a randomized data +−K(t). The randomized data +−K(t) is multiplied by the second value G2(1) before input into the summation block 117. In doing so, a sequence of randomized dividing ratio N+−K is fed into the control bit of the multi-modulus divider 109 such that it brings a N.F. division effect to the phase locked loop 12 over the modulation periods.

Figure 10:
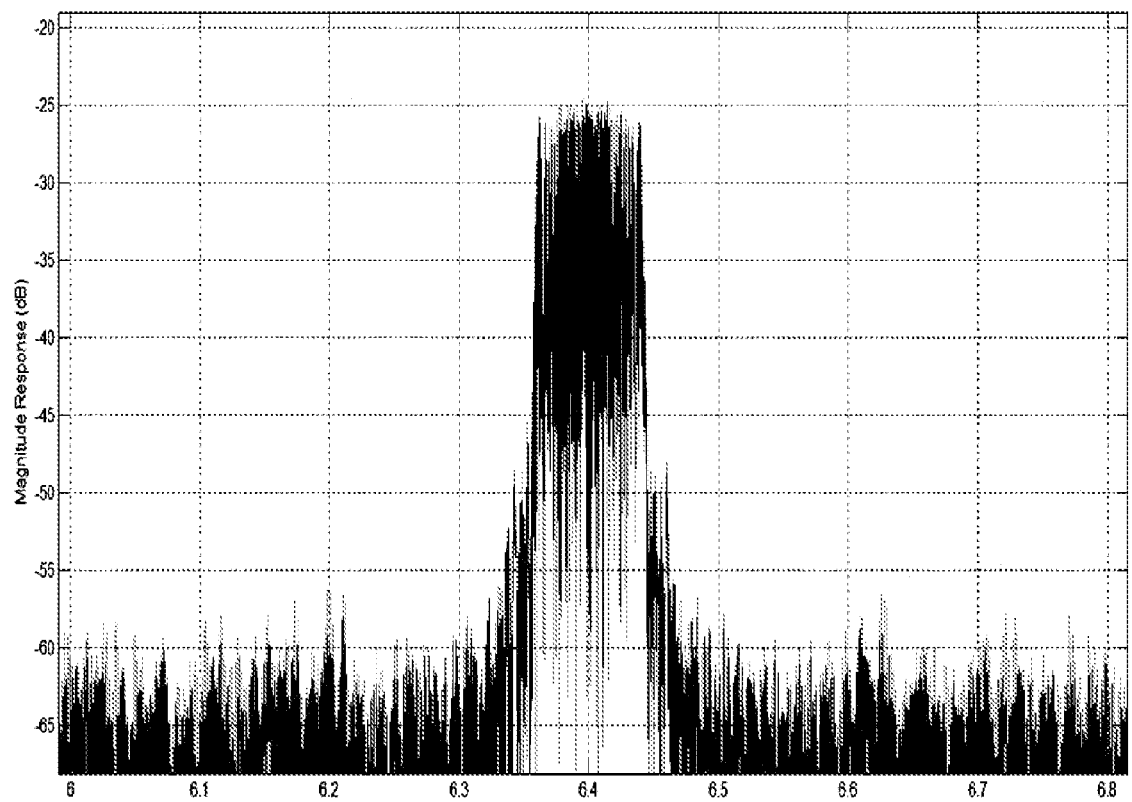
FIG. 10 is a Fast Fourier Transform (FFT) graph of the control voltage signal for VCO 107 having a 640 MHz clock with a −0.6% to +0.6% modulation depth.

FIG. 10 is a Fast Fourier Transform (FFT) graph of the control voltage signal for VCO 107 having a 640 MHz clock with a −0.6% to +0.6% modulation depth. 0.6% of 640 MHz is 3.84 MHz. Thus, a 640 MHz clock with −0.6% to +0.6% modulation depth indicates that the modulation clock is varying within a band of 636.16 MHz to 643.84 MHz. Referring to FIG. 10, the modulation clock has a high magnitude within a band of 636.16 MHz to 643.84 MHz along with X-axis. Thus, the graph of FIG. 10 shows that the sigma delta block 130 successfully modulates a 0.6% spread spectrum modulation depth.

Another example of the embodiment includes that the first value G1 is 0.6 and the second value G2 is 2. Thus, the G1 (0.6)×G2 (2) equals to 1.2%. It is examined whether the sigma delta block 130 modulates 1.2% spread spectrum modulation depth. The result is described hereafter with reference to FIGS. 11A, 11B, 11C, 11D and 12.

Figure 11A:
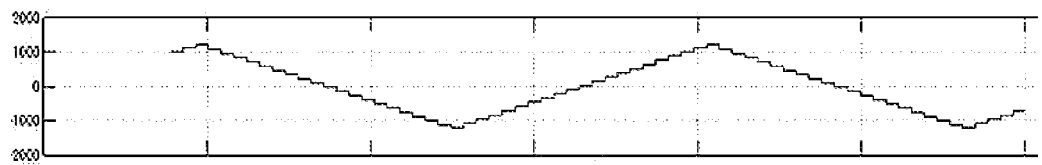
FIG. 11A is a graph showing the modulation profile input data from the memory according to one exemplary of another embodiment.
Figure 11B:
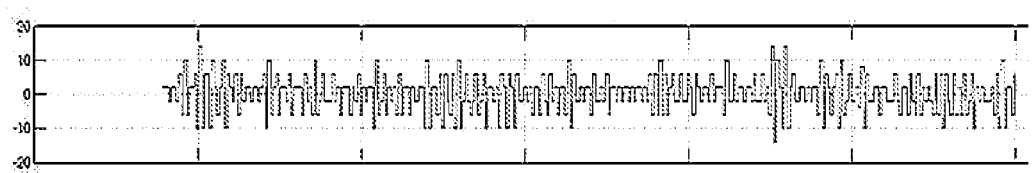
FIG. 11B is a graph showing the randomized data +−K(t) when the first value is 0.6 and the second value is 2.
Figure 11C:
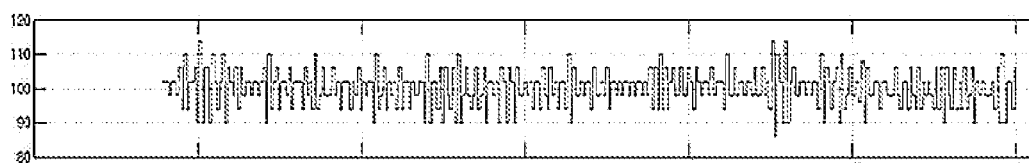
FIG. 11C is a graph showing a sum of N and the randomized data +−K(t).
Figure 11D:
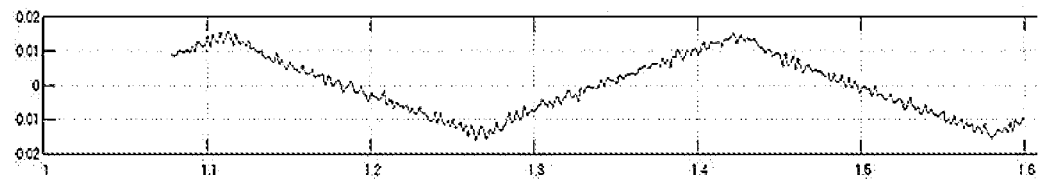
FIG. 11D is a graph showing the control voltage signal for VCO.

FIG. 11A is a graph showing the modulation profile input data. The input data from the memory 111 has a triangular shape. FIG. 11B is a graph showing the randomized data +−K(t) when the first value G1 is 0.6 and the second value G2 is 2. FIG. 11C is a graph showing a sum of N and the randomized data +−K(t). FIG. 11D is a graph showing the control voltage signal for VCO 107. FIGS. 11A, 11B, 11C and 11D have the same time grid along an X-axis. The waveform of the control voltage signal for VCO has a triangular shape with fluctuations reflecting the randomized data.

The modulation profile input data from the memory 111 is multiplied by the first value G1(0.6) before input into the first sigma delta modulator 131. The first sigma delta modulator 131 generates a randomized data +−K(t). The randomized data +−K(t) is multiplied by the second value G2(2) before input into the summation block 117. In doing so, a sequence of randomized dividing ratio N+−K is fed into the control bit of the multi-modulus divider 109 such that it cause a N.F. division effect to the phase locked loop 12 over the modulation periods.

Figure 12:
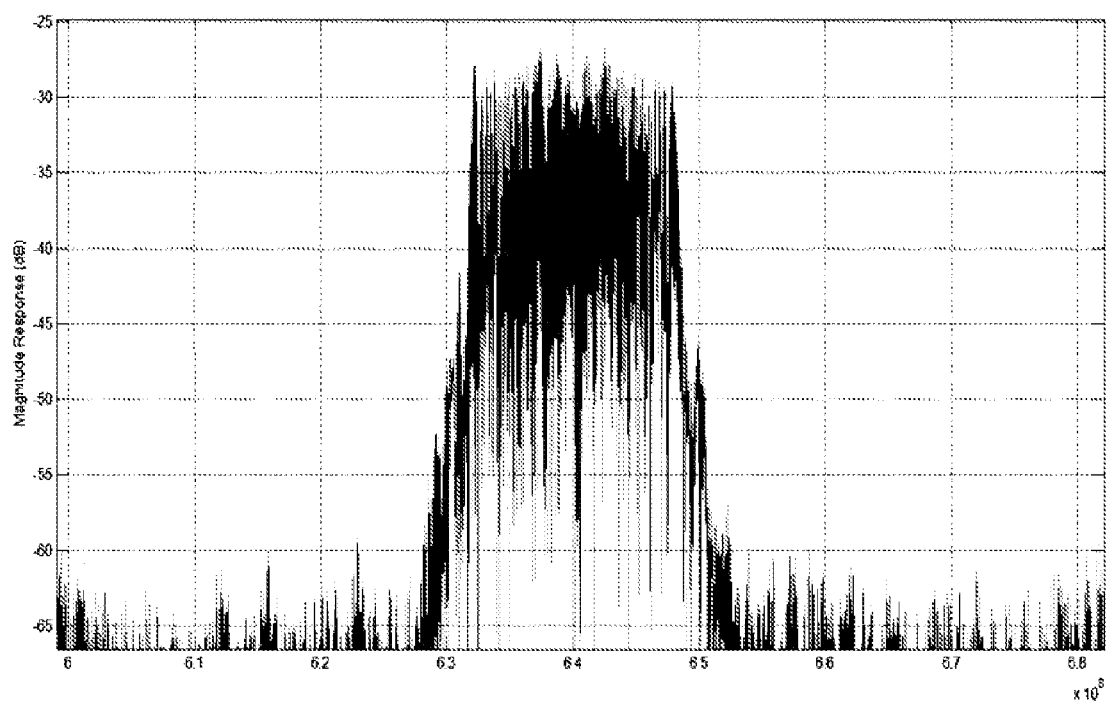
FIG. 12 is a Fast Fourier Transform (FFT) graph of the control voltage signal for VCO having a 640 MHz clock with a −1.2% to +1.2% modulation depth.

FIG. 12 is a Fast Fourier Transform (FFT) graph of the control voltage signal for VCO 107 having a 640 MHz clock with a −1.2% to +1.2% modulation depth. 1.2% of 640 MHz is 7.68 MHz. Thus, a 640 MHz clock with −1.2% to +1.2% modulation depth indicates that the modulation clock is varying within a band of 632.32 MHz to 647.68 MHz. Referring to FIG. 12, the modulation clock has a high magnitude within a band of 632.32 MHz to 647.68 MHz along with X-axis. Thus, the graph of FIG. 12 shows that the sigma delta block 130 successfully modulates a spread spectrum modulation depth.

The phase locked loop that is programmable the spread spectrum modulation depth can achieve PVT (process, voltage, and temperature) invariant precision through pure digital control. Thus, the LED driving circuit having the phase locked loop can attenuate LED display panel's EMI radiation.

Figure 13:
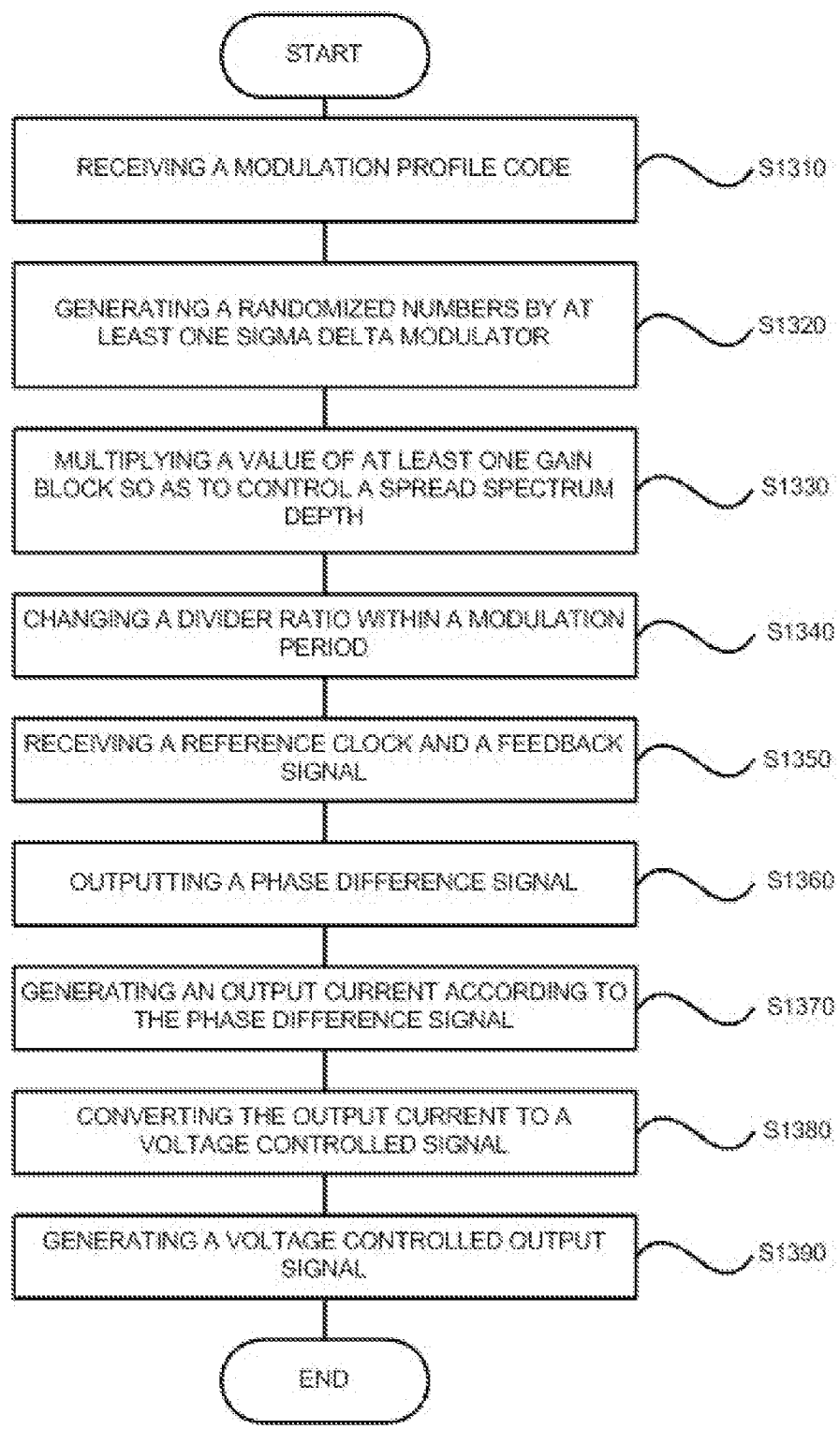
FIG. 13 is a schematic flowchart of the method for driving a phase locked loop circuit of a LED display panel.

FIG. 13 is a schematic flowchart illustrating the method for driving a phase locked loop circuit of a LED display panel. Step 1310 refers to a step of receiving a modulation profile code. Step 1320 refers to a step of generating a random numbers by at least one sigma delta modulator. Step 1330 refers to a step of multiplying a value of at least one gain block so as to control a spread spectrum modulation depth. Step 1340 refers to a step of changing a dividing ratio over a modulation period. Step 1350 refers to a step of receiving a reference clock and a feedback signal. Step 1360 refers to a step of outputting a phase difference signal. Step 1370 refers to a step of generating an output current according to the phase difference signal. Step 1380 refers to a step of converting the output current to a voltage controlled signal. Step 1390 refers to a step of generating a voltage controlled output signal.

It is to be understood that the exemplary embodiments described herein are that for presently embodiments and thus should be considered in a descriptive sense only and not for purposes of limitation. The modifications and embodiments are intended to be included within the scope of the dependent claims. Descriptions of features or aspects within each embodiment should typically be considered as available for other similar features or aspects in other embodiments. Many modifications and other embodiments of the disclosure will come to the mind of one skilled in the art having the benefit of the teaching presented in the forgoing descriptions and the associated drawings.

What is claimed is:

1. An apparatus for driving LED display comprising a plurality of phase locked loop circuits, each of the phase locked loop circuits comprising:
    a phase frequency detector configured to generate a phase difference signal according to a feedback signal and a reference signal;
    a charge pump configured to receive the phase difference signal and to generate an output current according to the phase difference signal to adjust phase alignment;
    a loop filter configured to receive the output current and to convert the output current to a voltage controlled signal;
    a voltage controlled oscillator configured to receive the voltage controlled signal and to generate a voltage controlled output signal;
    a divider configured to receive the voltage controlled output signal and a randomized number, and generate the feedback signal;
    a memory configured to generate a sequence of modulation profile codes; and a sigma delta block comprising
at least one sigma delta modulator; and
at least one gain block,
wherein the sigma delta block is configured to receive the sequence of modulation profile codes and generate the sequence of randomized number to the divider,
wherein each of the at least one gain block is configured to generate a value that is multiplied to at least one of the at least one sigma delta modulator so as to change a spread spectrum modulation depth,
wherein the at least one sigma delta modulator and the at least one gain block are coupled in a series configuration,
wherein the at least one sigma delta modulator comprises a first sigma delta modulator, and the at least one gain block has a first gain block and a second gain block, and wherein the first gain block is coupled between the memory and the first sigma delta modulator, and the second gain block is coupled between the first sigma delta modulator and the divider, and
wherein the first gain block generates a fractional value, and the second gain block generates an integer value.

2. The apparatus of claim 1, wherein the at least one sigma delta modulator has a plurality of sigma delta modulators, and the plurality of sigma delta modulators are coupled to one another in either a series configuration or a parallel configuration.

3. The apparatus of claim 2, wherein the at least one gain block has a plurality of gain blocks, and each of the gain blocks is coupled to at least one of the sigma delta modulators.

4. An apparatus for driving LED display comprising a plurality of phase locked loop circuits, each of the phase locked loop circuits comprising:
a phase frequency detector configured to generate a phase difference signal according to a feedback signal and a reference signal;
a charge pump configured to receive the phase difference signal and to generate an output current according to the phase difference signal to adjust phase alignment;
a loop filter configured to receive the output current and to convert the output current to a voltage controlled signal;
a voltage controlled oscillator configured to receive the voltage controlled signal and to generate a voltage controlled output signal;
a divider configured to receive the voltage controlled output signal and a randomized number, and generate the feedback signal;
a memory configured to generate a sequence of modulation profile codes; and
a sigma delta block comprising
at least one sigma delta modulator; and
at least one gain block,
wherein the sigma delta block is configured to receive the sequence of modulation profile codes and generate the sequence of randomized number to the divider, and
wherein each of the at least one gain block is configured to generate a value that is multiplied to at least one of the at least one sigma delta modulator so as to change a spread spectrum modulation depth,
wherein the at least one sigma delta modulator has a first sigma delta modulator and a second sigma delta modulator, and wherein the first sigma delta modulator and the second sigma delta modulator are coupled in a parallel configuration,
wherein the at least one gain block comprises a first gain block and a second gain block, and wherein the first sigma delta modulator and second sigma delta modulator are coupled to the first gain block and second gain block, respectively, and
wherein the first gain block and the second gain block have a first value and a second value, respectively, and wherein the first value is an integer value, and the second value is a fractional value.

5. The apparatus of claim 4, wherein the first gain block is coupled between the first sigma delta modulator and the divider, and the second gain block is coupled between the memory and the second sigma delta modulator.

6. The apparatus of claim 4, wherein the sigma delta block further comprises a shift operator.

7. A method for driving a phase locked loop circuit of a LED display panel, the method comprising:
receiving a sequence of modulation profile codes;
generating a sequence of randomized numbers by at least one sigma delta modulator;
multiplying a value of at least one gain block so as to change a spread spectrum modulation depth value;
changing a sequence of dividing ratios over a modulation period;
receiving a reference clock and a feedback signal;
outputting a phase difference signal;
generating an output current according to the phase difference signal;
converting the output current to a voltage controlled signal; and
generating a voltage controlled output signal.

8. The method of claim 7, wherein the method comprising, in the following order,
receiving the sequence of modulation profile codes;
generating the sequence of randomized numbers by the at least one sigma delta modulator; and
multiplying the value by the at least one gain block wherein the value is multiplied to at least one of the at least one sigma delta modulator so as to change the spread spectrum modulation depth value.

9. The method of claim 7, wherein the method comprising, in the following order,
receiving the sequence of modulation profile codes;
multiplying the value to the sequence of modulation profile codes by the at least one gain block so as to change the spread spectrum modulation depth value; and
generating the sequence of randomized numbers by the at least one sigma delta modulator.

10. The method of claim 7, wherein the at least one sigma delta modulator has a first sigma delta modulator and a second sigma delta modulator, and wherein the at least one gain block comprises a first gain block and a second gain block, and wherein the first sigma delta modulator and second sigma delta modulator are coupled to the first gain block and second gain block, respectively.

11. The method of claim 10, wherein the first sigma delta modulator and the second sigma delta modulator are coupled in a parallel configuration.

12. The method of claim 10, wherein the method of receiving the sequence of modulation profile codes, generating the sequence of randomized numbers, and multiplying a value comprising, in the following order,
receiving the sequence of modulation profile codes from a memory;
generating the sequence of randomized numbers by the first sigma delta modulator;
multiplying a first value to the first sigma delta modulator by the first gain block wherein the first value is an integer value;

multiplying a second value to the modulation profile codes by the second gain block wherein the second value is a fractional value; and receiving an output of the second gain block and generating the sequence of randomized numbers by the second sigma delta modulator.

13. The method of claim 11, wherein the second value equals 0.1n, where n is an integer from 0 to 9.

14. The method of claim 7, wherein the at least one sigma delta modulator has a first sigma delta modulator, and the at least one gain block has a first gain block and a second gain block, wherein the method of receiving the sequence of modulation profile codes, generating a sequence of randomized numbers, and multiplying a value comprising, in the following order, receiving the sequence of modulation profile codes from a memory;

multiplying a first value to the sequence of modulation profile codes by the first gain block wherein the first value is a fractional value;

generating the sequence of randomized numbers by the first sigma delta modulator; and multiplying a second value to the sequence of randomized numbers by the second gain block wherein the second value is an integer value.

15. The method of claim 14, wherein the first value equals 0.1 n, where n is an integer from 0 to 9.

16. An apparatus for driving LED display comprising a plurality of phase locked loop circuits, each of the phase locked loop circuits comprising:

a phase frequency detector configured to generate a phase difference signal according to a feedback signal and a reference signal;

a charge pump configured to receive the phase difference signal and to generate an output current according to the phase difference signal so as to adjust phase alignment;

a loop filter configured to receive the output current and to convert the output current to a voltage controlled signal;

a voltage controlled oscillator configured to receive the voltage controlled signal and to generate a voltage controlled output signal;

a divider configured to receive the voltage controlled output signal and a randomized number, and generate the feedback signal, wherein the divider receives the randomized number so as to change a dividing ratio over a modulation period;

a memory configured to generate a modulation profile code; and a sigma delta block comprising a plurality of sigma delta modulators; and a plurality of gain blocks;

wherein the sigma delta block is configured to receive the modulation profile codes and generate the randomized numbers to the divider, wherein the plurality of the sigma delta modulators are coupled one another in parallel, wherein at least one of the plurality of the gain blocks is coupled to at least one of the sigma delta modulators, wherein at least one of the gain blocks is configured to generate either an integer value or a fractional value, wherein at least one of the integer value and the fractional value is multiplied to at least one of the sigma delta modulators so as to change a spread spectrum modulation depth value.

* * * * *